United States Patent [19]
Galvier et al.

[11] Patent Number: 5,186,786
[45] Date of Patent: Feb. 16, 1993

[54] METHOD FOR DETERMINING THE COMPLETE ELIMINATION OF A THIN LAYER ON A NON PLANAR SUBSTRATE

[75] Inventors: Jean Galvier, Saint Martin D'Heres; Philippe Gayet, Saint Vincent De Mercuze; Annie Tissier, Saint Ismier, all of France

[73] Assignee: France Telecom (CNET), Paris, France

[21] Appl. No.: 732,192

[22] Filed: Jul. 19, 1991

[30] Foreign Application Priority Data

Jul. 20, 1990 [FR] France .................. 90 09467

[51] Int. Cl.⁵ .................................... H01L 21/306
[52] U.S. Cl. ............................ 156/626; 156/656; 156/657; 204/192.33
[58] Field of Search ............ 156/626, 627, 656, 657; 204/192.33; 356/382

[56] References Cited

U.S. PATENT DOCUMENTS 4,141,780  2/1979  Kleinknecht et al. .
4,680,084  7/1987  Heimann et al. ............ 156/626
4,927,785  5/1990  Theeten et al. .

OTHER PUBLICATIONS

Thin Solid Films, "Optical Monitoring of the End Point in Thin Film Plasma Etching", 109, 1983, pp. 363–369.
SPIE vol. 990, Chemical, Biochemical and Environmental Applications of Fibers (1988), "Non-Destructive Testing of Reflow on SI Wafer", Laloux, et al., pp. 158–162.

*Primary Examiner*—Thi Dang
*Attorney, Agent, or Firm*—Lowe, Price, LeBlanc & Becker

[57] ABSTRACT

A method for determining the complete elimination of a thin layer (3) deposited on a substrate (1) includes the steps of providing on an area of the substrate (1) an optical diffraction grating (2, 2'), the thin layer deposited on the substrate also covering this diffraction grating, and the etching of the thin layer being also carried out in the area of the diffraction grating; illuminating the grating (2, 2') with a monochromatic light beam; and observing the evolution of the diffracted light during the etching of the thin layer, in order to determine the moment when the material of the thin layer is entirely removed.

6 Claims, 1 Drawing Sheet

METHOD FOR DETERMINING THE COMPLETE ELIMINATION OF A THIN LAYER ON A NON PLANAR SUBSTRATE

BACKGROUND OF THE INVENTION

The present invention relates to a method for detecting the end of etching, and more particularly the complete elimination, of a thin layer deposited on a substrate. The invention applies to the field of integrated circuit manufacturing, in particular to detect the end of the etching of a thin metallic layer deposited on a substrate having a rugged surface.

In a certain amount of operations involved in the manufacturing of integrated circuits, it is often necessary to etch a metallic layer deposited on a layer of insulating material. This is the case, for example, during the realization of a plurality of interconnection levels, in which one conventionally proceeds by etching parts of the metallic layer deposited on a silicon oxide layer which takes up the shape of the underlying structures and which consequently has a rugged surface. It is wished, in this case, to proceed with the etching operation until complete removal of this metallic layer is obtained in certain areas. It is nevertheless necessary to stop this etching operation rapidly after this complete removal of the metallic layer, because the continuation of this etching could modify or alter other structures and would uselessly prolong the duration of the manufacturing.

A difficulty is due to the fact that, in the final phase of the etching operation, the metallic layer subsists only in the form of very small size metallic residues. Usually, these residues are located near steps present in the underlying insulating layer. Because these residues are of small size, they are not detectable by conventional end of etching detection systems. Hence, to be certain that no residue remains after this etching operation, the etching of the metallic layer must classically be prolonged.

An object of the present invention is to provide a method for a precise determination of the complete elimination of a thin layer deposited on a substrate.

Another object of the present invention is to provide such a method which can be used as a controlling means for verifying if the etching operation has been satisfactorily carried out.

Another object of the present invention is to provide such a method which can be carried out in situ during the etching operation.

SUMMARY OF THE INVENTION

To achieve these objects, the invention provides a method for determining the complete elimination of a thin layer deposited on a substrate, comprising the steps of providing on an area of the substrate an optical diffraction grating, the thin layer deposited on the substrate also covering this diffraction grating, and the etching of the thin layer being also carried out in the area of the diffraction grating; illuminating the grating with a monochromatic light beam; and observing the evolution of the diffracted light during the etching of the thin layer, in order to determine the moment when the material of the thin layer is entirely removed.

According to an embodiment of the present invention, the substrate corresponds to a silicon oxide layer, the diffraction grating is obtained by anisotropic etching of a determined area of this layer, and the thin layer is metallic.

According to an embodiment of the present invention, the diffraction pattern obtained from said grating is compared to the diffraction patterns obtained during a calibration.

BRIEF DESCRIPTION OF THE DRAWINGS

The foregoing and other objects, features and advantages of the present invention will be described in more detail in the following description of particular embodiments by referring to the attached drawings in which.

DESCRIPTION OF THE PREFERRED EMBODIMENTS

The method according to the invention will be described in the particular case of the etching of the second interconnection level of an integrated circuit with a plurality of interconnection levels. It is however clear that this is only an example and that the invention generally applies to the determination of the complete elimination of a thin layer.

To achieve a plurality of interconnection levels, a first metallic layer is deposited and etched according to a chosen connection pattern, then an insulating layer is deposited, often silicon oxide, in which pass-through holes are provided. Over the insulating layer, a second metallic layer which fills the pass-through holes is deposited. Etching of this second metallic layer is then achieved in order to completely remove the metal of this layer present on the underlying insulating layer, and only preserving metal inside the pass-through holes provided in the insulating layer. Finally a third layer is deposited which is etched according to a chosen connection pattern. The etching operation of the second metallic layer is particularly delicate. Indeed, this etching must be prolonged sufficiently so that no metallic residue remains on the insulating layer, but this etching operation must not be prolonged in excess in order to avoid the removal of too much of the metal present in the holes.

Figure 1A:
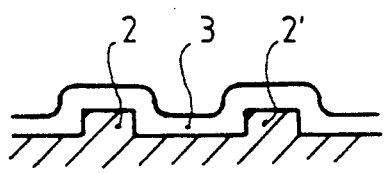
FIG. 1A schematically represents, in cross section, a structure resulting from the carrying out of the method according to the invention, such as it appears in an initial phase of the etching operation.

As it is shown in FIG. 1A, according to the invention, in the case of the etching of the second metallic layer, in an unused area of a wafer being processed, an insulating layer 1 forming part of the aforementioned insulating layer is deposited. In this area, an optical diffraction grating constituted of a certain amount of equidistant ribs 2, 2' is formed. The height of the ribs is of the same order of magnitude as the height of the steps present on the rest of the wafer in the areas of the circuits being realized. The second metallic layer 3 covering the insulating layer 1 also covers the area comprising the diffraction grating 2, 2' and takes up the shapes of the ribs. The etching of this metallic layer 3 is achieved in the area comprising the diffraction grating at the same time as in the useful area.

Figure 2A:
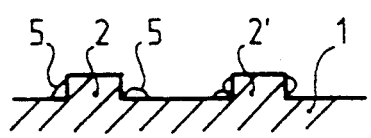
FIGS. 2A and 2B correspond respectively to FIGS. 1A and 1B during an intermediate phase of the etching operation.

FIG. 2A represents the same structure at a moment when the etching operation of the metallic layer 3 is almost terminated. Residues 5 of the metal of the layer 3 subsist, these residues being principally located at the foot of vertical walls of the diffraction grating or at proximity. These residues 5 can be of various shapes and are of a very small size. As long as such residues 5 remain, the etching operation must be continued until their complete removal is obtained, as it has previously been described.

Figure 3A:
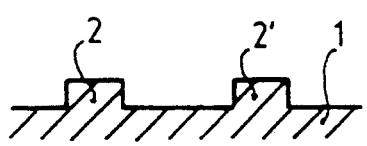
FIGS. 3A and 3B correspond respectively to FIGS. 1A and 1B during the final etching phase.

FIG. 3A represents the structure at a moment when the residues have completely disappeared.

According to a manner of carrying out the present invention, during the etching operation of the layer 3, the diffraction grating is illuminated by a monochromatic light beam and the evolution of the diffracted light is observed.

Figure 1B:
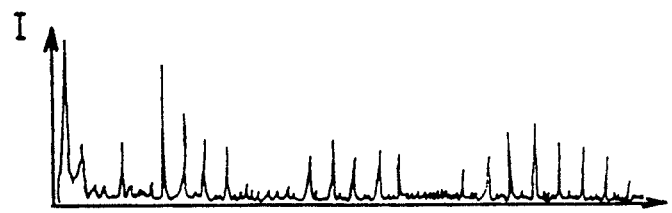
FIG. 1B represents a diffraction pattern corresponding to the structure of FIG. 1A.
Figure 2B:
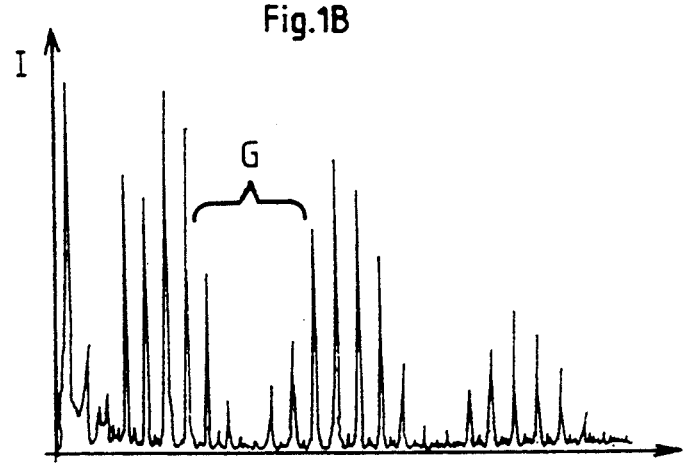
Figure 3B:
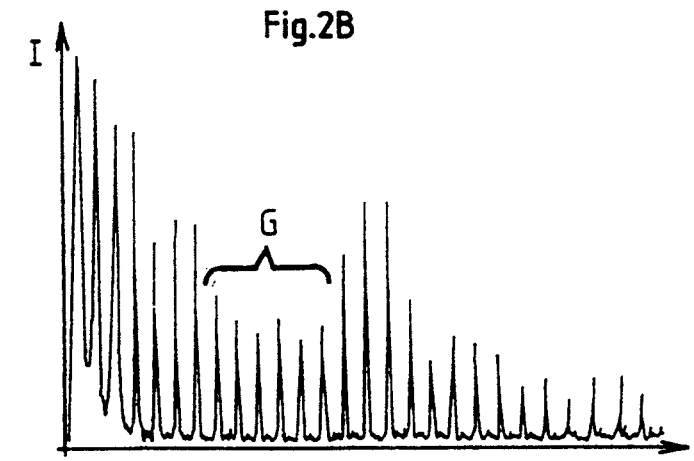

FIGS. 1B, 2B and 3B represent the diffraction patterns corresponding to the structures respectively represented in FIGS. 1A, 2A and 3A. A series of intense light spots are observed on either side of the specular reflection spot (only one side of the diffraction pattern is represented in FIGS. 1B to 3B and only above order 6).

The applicants have noted that the diffraction pattern is continuously modified at the beginning of the etching operation of the metallic layer 3. This diffraction pattern is very perceptibly modified when passing from a continuous layer 3 to spread residues and when passing from the etching level corresponding to FIG. 2A to that corresponding to FIG. 3A, i.e. when passing from a structure in which very small size metallic residues remain, to a structure without metallic residues. Hence, the invention enables the detection in a very sensitive way of the presence or the absence of very small size metallic residues, and this nearly instantaneously, during the carrying out of the etching operation.

To automatically exploit the modifications of the diffraction pattern, the spectrum can be comprehensively studied or one diffraction spot or a certain group G of diffraction spots can be selected in this diffraction pattern. The light intensity of this spot or this group of spots varies in great proportion when passing from an etching phase during which metallic residues 5 subsist to a final etching phase in which the metallic residues are completely eliminated. One can then easily measure in an automatic way the light intensity of this group of spots in order to determine the moment when the metallic residues 5 are entirely removed, this moment being defined by the fact that the value of this light intensity reaches a predetermined threshold.

The light intensity measure of one or more spots can be achieved by an analyser moving along the diffraction pattern. The measure can also be achieved by sampling with a diode linear array.

The light beam is for example obtained by a laser of the helium/neon type operating at a wavelength of 632.8 nm.

The person skilled in the art will note that, although the invention has been described in relation with a particular application, it generally applies to the detection of the complete elimination of a thin layer deposited on a massive substrate or on another thin layer.

Furthermore, a manner of carrying out in situ the method according to the present invention has been described hereabove, in which the pattern to be tested is illuminated in the etching environment. The present invention can also be used for controlling etched wafers. In this case, one will compare the diffraction pattern obtained by illuminating a rib pattern 2 that has been etched to the diffraction patterns previously obtained during calibration phases. This control method has the advantage of being accurate, non destructive and non polluting. Thus, if one detects that a batch of wafers has not been sufficiently etched, it will be possible, with no drawbacks, to subject it to an additional etching phase.

Although it has been described hereabove that a diffraction grating is specially formed in an unused area of the substrate, a useful pattern formed in part of the circuit being manufactured, for example a memory area, can be used.

We claim:

1. A method for determining the complete elimination of a thin layer deposited on a substrate, comprising the steps of:
    providing on an area of the substrate an optical diffraction grating having a diffraction pattern; depositing said thin film on the substrate wherein said thin layer also covers this diffraction grating; etching the thin layer;
    illuminating the grating with a monochromatic light beam; and
    observing the evolution of the diffracted light during the etching of the thin layer, in order to determine the moment when the material of the thin layer is entirely removed.

2. A method according to claim 1, comprising the steps of selecting in the diffraction pattern a group (G) of diffraction spots and measuring the light intensity of this group of spots, the moment when the material of the thin layer is entirely removed being defined by the fact that the value of this light intensity reaches a predetermined threshold.

3. A method as claimed in claim 1, wherein the substrate is a silicon oxide layer and wherein the diffraction grating is formed by anisotropic etching of a determined area of said silicon oxide layer.

4. A method as claimed in claim 1, wherein the thin layer is metallic.

5. A method as claimed in claim 1, wherein the diffraction pattern obtained from said grating is compared to diffraction patterns obtained during a calibration.

6. A method as claimed in claim 1, wherein the diffraction grating is a portion of an integrated circuit being formed on said substrate.

* * * * *